(12) United States Patent
Louzir et al.

(10) Patent No.: US 9,893,411 B2
(45) Date of Patent: Feb. 13, 2018

(54) ELECTRICAL ACTIVITY SENSOR DEVICE FOR DETECTING ELECTRICAL ACTIVITY AND ELECTRICAL ACTIVITY MONITORING APPARATUS

(71) Applicant: THOMSON LICENSING, Issy les Moulineaux (FR)

(72) Inventors: Ali Louzir, Rennes (FR); Jean-Yves Le Naour, Pace (FR); Maxime Ruee, Vitre (FR)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 15/168,040

(22) Filed: May 28, 2016

(65) Prior Publication Data
US 2016/0351994 A1    Dec. 1, 2016

(30) Foreign Application Priority Data
May 29, 2015   (EP) .................................... 15305815

(51) Int. Cl.
| | | |
|---|---|---|
| *G06K 19/077* | (2006.01) | |
| *H01Q 1/22* | (2006.01) | |
| *G01R 19/15* | (2006.01) | |
| *G01R 19/25* | (2006.01) | |
| *G07C 3/00* | (2006.01) | |
| *G06K 7/10* | (2006.01) | |

(Continued)

(52) U.S. Cl.
CPC ........... *H01Q 1/2225* (2013.01); *G01D 4/004* (2013.01); *G01R 15/181* (2013.01); *G01R 19/15* (2013.01); *G01R 19/2513* (2013.01); *G06K 7/10316* (2013.01); *G06K 19/07773* (2013.01); *G07C 3/00* (2013.01); *H01Q 7/00* (2013.01); *H01Q 9/065* (2013.01); *Y02B 70/3266* (2013.01); *Y02B 90/242* (2013.01); *Y02B 90/248* (2013.01); *Y04S 20/242* (2013.01); *Y04S 20/322* (2013.01); *Y04S 20/52* (2013.01)

(58) Field of Classification Search
USPC .......................... 235/492; 340/870.02, 572.1
See application file for complete search history.

(56) References Cited

U.S. PATENT DOCUMENTS

| | | | | |
|---|---|---|---|---|
| 2007/0046552 A1* | 3/2007 | Marino | ................. | G06Q 10/08 343/720 |
| 2009/0167494 A1 | 7/2009 | Martins | | |

(Continued)

FOREIGN PATENT DOCUMENTS

| | | |
|---|---|---|
| CN | 201837467 | 5/2011 |
| EP | 1959263 | 8/2008 |

(Continued)

*Primary Examiner* — Allyson Trail
(74) *Attorney, Agent, or Firm* — Brian J. Dorini; Patricia A. Verlangieri

(57) ABSTRACT

The invention relates to electrical activity sensor attachable to a power cable of an electrical device for detecting an impulse generated in the power cable in response to a change in electrical power state of the electrical device. The electrical activity sensor includes an antenna assembly having an antenna element operable to magnetically couple with an electrical pulse generated in the power cable to induce an electrical signal in response to a change in electrical power state of the electrical device. The antenna element is shaped in a plurality of loops.

12 Claims, 15 Drawing Sheets

(51) Int. Cl.
*H01Q 7/00* (2006.01)
*H01Q 9/06* (2006.01)
*G01R 15/18* (2006.01)
*G01D 4/00* (2006.01)

(56) References Cited

U.S. PATENT DOCUMENTS

| | | |
|---|---|---|
| 2009/0184804 A1 | 7/2009 | Seppa |
| 2012/0013442 A1 | 1/2012 | Lee |
| 2012/0280828 A1* | 11/2012 | Kim .................. H04Q 9/00 340/870.02 |
| 2013/0335105 A1 | 12/2013 | Washiro |
| 2015/0130480 A1* | 5/2015 | Berkcan ............. H04Q 9/00 324/633 |

FOREIGN PATENT DOCUMENTS

| | | |
|---|---|---|
| JP | 2003232829 | 8/2003 |
| JP | 2007093469 | 4/2007 |
| WO | WO2014173783 | 10/2014 |

* cited by examiner

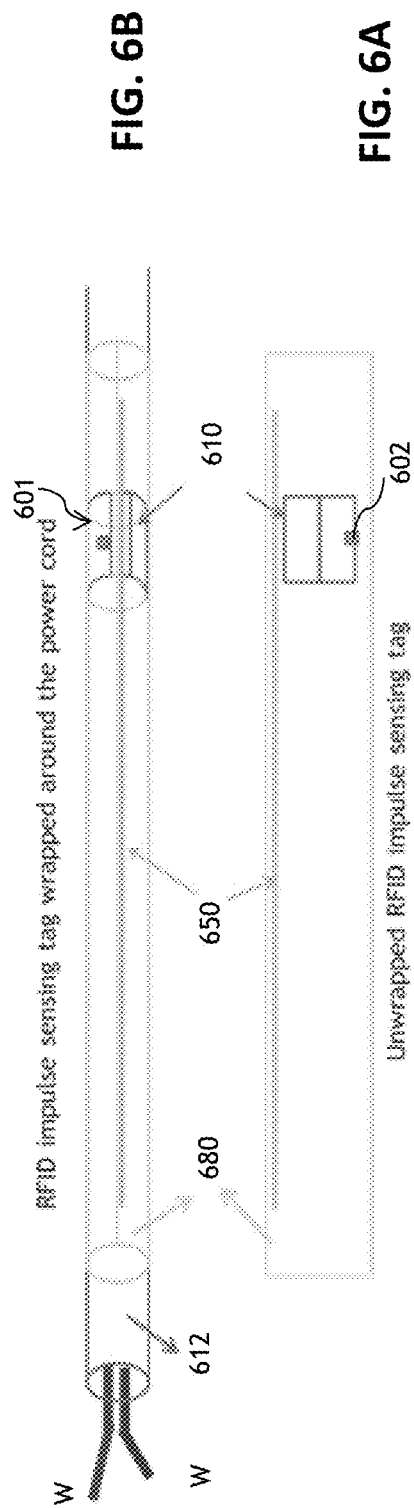

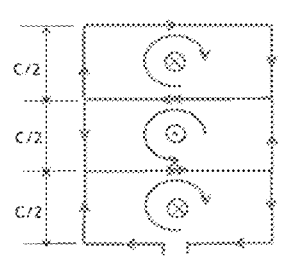 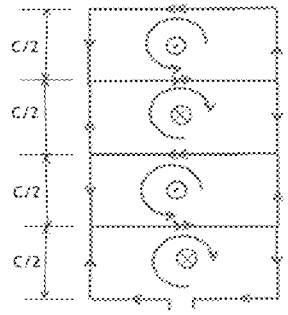 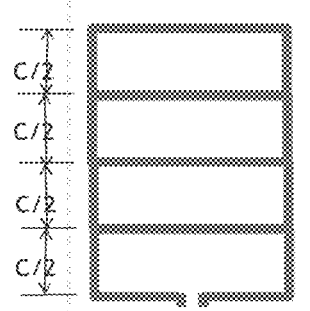
FIG. 11A  FIG. 11B  FIG. 11C

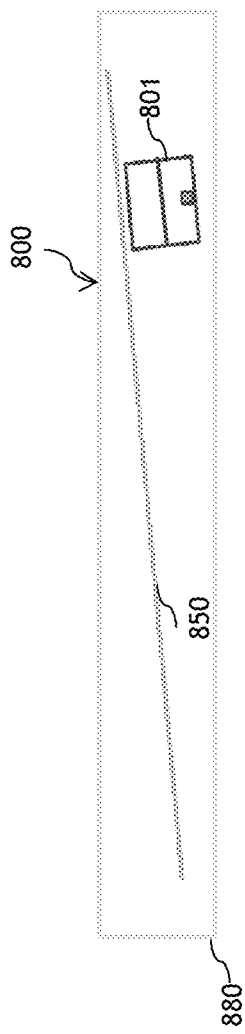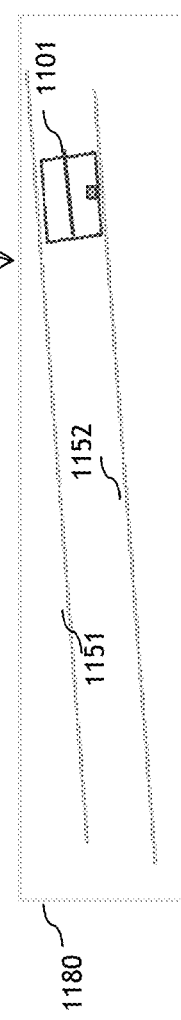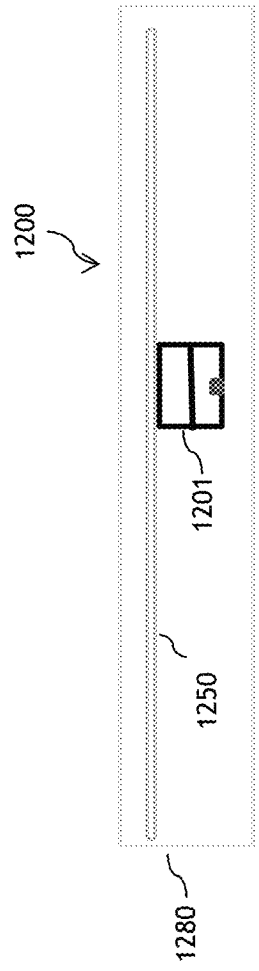

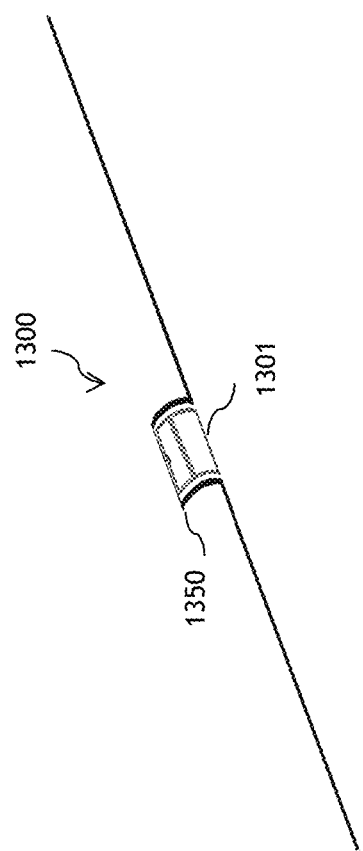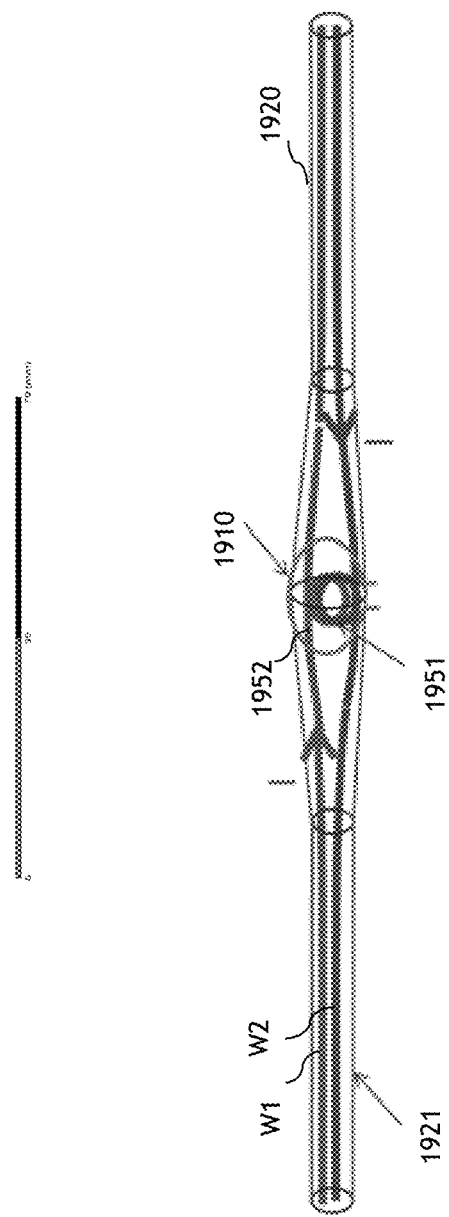

Magnetic field produced by a long straight wire at a distance r
$B = \mu I / 2\pi r$ Total magnetic field produced by one long straight wire and with a loop at a center of a loop r Magnetic field produced by a circular wire loop of radius r at the center of the loop
$B = \mu I / 2r$

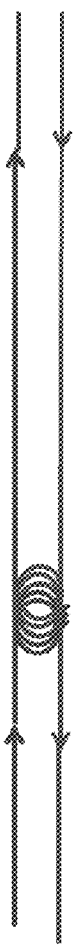

ELECTRICAL ACTIVITY SENSOR DEVICE FOR DETECTING ELECTRICAL ACTIVITY AND ELECTRICAL ACTIVITY MONITORING APPARATUS

This application claims the benefit, under 35 U.S.C. § 119 of European Patent Application No. 15305815.1, filed May 29, 2015.

TECHNICAL FIELD

The present invention relates to an electrical activity sensor device for detecting the electrical activity of an electrical device connected to a power supply network, in particular the change in electrical power state. The invention further relates to an electrical activity monitoring apparatus for monitoring the electrical activity of one or more electrical devices. The electrical activity sensor device may be based on an antenna device such as for example a radio frequency identification device (RFID).

BACKGROUND

The monitoring of electrical activity of electrical devices finds many useful applications in areas such as energy consumption, building user activity profiles, and security or safety monitoring systems. For example, in a home environment knowledge of the activity of electrical appliances such as washing machines, lighting devices; cookers, toaster or a coffee machine may provide useful information on the household habits and user activity enabling a profile to be built up.

A known solution for monitoring the activity of electrical devices employs a complex electrical meter system based on remote controlled modules plugged into power outlets and configured to measure the electrical consumption of the electrical equipment powered from the respective power outlet. Such, remote controlled modules are typical equipped with a wireless communication system generally based on low power wireless technology to remotely monitor and control the corresponding electrical appliance. Such advanced meter systems require however a complex and expensive customized installation. Indeed, a recent research report on home automation and monitoring indicated price and technical complexity as being the main market hurdles and inhibitors against widespread adoption. Another drawback of such techniques is that electrical devices may be moved from one power outlet to another power outlet. Moreover some devices such as lighting devices are not always powered from a power outlet.

Other solutions for the detection of the activity of electrical devices are based on sensing their "EMI (electromagnetic interference) signature" by monitoring the powerlines at one or several points of the power supply network. These techniques require however a customised calibration and training process to learn the EMI signature of various devices. Moreover the EMI signatures may evolve with time. Complex signal processing techniques are required to disaggregate the signatures of the various active devices connected to the network and the obtained results are not always very accurate.

The present invention has been devised with the foregoing in mind.

SUMMARY

In a general form the invention concerns an electrical activity sensor device based on an antenna device such as for example a radio frequency identification device (RFID).

According to a first aspect of the invention there is provided an electrical activity sensor attachable to a power cable of an electrical device for detecting an impulse generated in the power cable in response to a change in electrical power state of the electrical device, the electrical activity sensor comprising an antenna assembly including: an antenna element operable to magnetically couple with an electrical pulse generated in the power cable in response to a change in electrical power state of the electrical device to induce an electrical signal; wherein at least a part of the antenna element is formed in a plurality of loops for magnetic coupling with the electrical pulse in the power cable.

Improved coupling is provided with the electrical pulse of the power cable since interference from the wires of the power cable is reduced. Moreover the antenna assembly is less susceptible to changes in the form of the power cable.

A change in the electrical power state of a device may include the switching ON of the device, the switching OFF of the device, the switching from a standby mode to an ON power state, and the switching from an ON power state to a standby mode.

In an embodiment, the plurality of loops are configured to form the figure 8.

In an embodiment, the antenna element is formed in three or more loops arranged along a common axis.

In an embodiment, the plurality of loops are sized based on the circumference of the power cord.

In an embodiment, the side of each loop of the plurality of loops has an axial length corresponding to half of the circumference of the power cord.

In an embodiment, the antenna assembly comprises at least one dipole type antenna configured operate as a half wave dipole in the operating frequency range of the antenna element and to magnetically couple to the antenna element wherein the dipole type conductor is operable to wirelessly transmit data representative of the power state change of the electrical device from the antenna assembly to a remote radio frequency data reader.

The operational range of the antenna element is extended since data is transmitted to a remote reader via the dipole conductor antenna.

In an embodiment, the antenna element is provided with a radio frequency identification circuit comprising memory.

In an embodiment, the antenna element is coupled to the dipole type antenna at a coupling distance from one end of the dipole type antenna, the coupling distance being based upon the input impedance of the radio frequency identification circuit.

Taking into account the input impedance of the radio frequency identification circuit helps to reduce the effect of interference from wires in the cable.

In an embodiment, the coupling distance is such that the input impedance of the antenna assembly matches the input impedance of the radio frequency identification circuit.

In an embodiment, the coupling distance is based upon the radiation resistance of the dipole type antenna.

In an embodiment, the coupling distance is such as to increase the radiation resistance of the dipole conductor In an embodiment, the size of the antenna element is adjusted according to the input impedance of the radio frequency identification circuit at the RF operating frequency.

In an embodiment, the distance between the antenna element and the dipole type antenna is adjusted according to the input impedance of the radio frequency identification at the RF operating frequency.

In an embodiment, the antenna element comprises a near field RFID tag.

The use of a short range (near field) RFID tag combined with wireless transmission by the dipole type antenna enables power consumption to be reduced with respect to a long range (far field) RFID tag while enabling extended coverage to be provided by the dipole conductor.

In an embodiment, the antenna element is operable as a passive antenna element powered by electromagnetic induction via the power cable. This enables power consumption to be reduced by avoiding the use of batteries.

In one embodiment, the dipole type antenna is formed in a helical shape. In one example the helical shape size is such that a single turn helix is provided when the dipole type antenna is wrapped around the cable.

In one embodiment, a plurality of dipole type antennas are provided, with at least one dipole type antenna being arranged on each side of loop antenna In one embodiment, the dipole type antennas are arranged parallel to one another and overlap at least partially In one embodiment, the dipole type antenna has at least one fold in its shape.

In an embodiment, the dipole type antenna is arranged to extend along at least two sides of the antenna element. For example part of the dipole type antenna may be folded around three sides of the antenna element.

The data representative of the power state change of the electrical device may comprise identification data identifying the electrical activity sensor. For example the identification data may be enough to indicate an electrical power state change. In other embodiments the data representative of the power state change may be transmitted in addition to the identification data.

A second aspect of the invention provides an electrical activity sensor device for monitoring the electrical status of an electrical device, the electrical activity sensor device comprising: a power cable for supplying power to an electrical device, the power cable comprising electrical power wires, wherein at least a part of each electrical power wire is formed in a loop to magnetically couple with an antenna element attached to the power cable to induce a detectable electrical signal when the electrical device changes power state.

In an embodiment, each wire is shaped to form two parallel loops

In an embodiment, each wire is shaped to form a plurality of loops in an axial direction along its length.

In an embodiment, each wire is shaped to form a plurality of loops in a direction perpendicular to the axial length.

A third aspect of the invention provides an electrical activity monitoring apparatus for monitoring the electrical power status of at least one electrical device connected to a power supply network by a respective power cable and, the electrical activity monitoring apparatus comprising: a reader module for reading data received wirelessly from at least one electrical activity sensor according to any embodiment of the first aspect of invention attached to a respective power cable of an electrical device; and a monitor device for determining from the data received by the reader module, which electrical devices of the network have changed electrical power status.

A fourth aspect of the invention provides an electrical activity monitoring apparatus for monitoring the electrical power status of at least one electrical device connected to a power supply network by a respective power cable and, the electrical activity monitoring apparatus comprising: a reader module for reading data received wirelessly from at least one electrical activity sensor and a respective power cable according to any embodiment of the second aspect of the invention of an electrical device; and a monitor device for determining from the data received by the reader module, which electrical devices of the network have changed electrical power status.

A fifth aspect of the invention provides an electrical activity monitoring system comprising at least one electrical activity sensor, according to any one embodiment of the first aspect or the second aspect of the invention, a reader module for reading data received wirelessly from each electrical activity sensor; and a monitor device for determining from the data received by the reader module, which electrical devices of the network have changed electrical power status.

A further aspect of the invention relates to a gateway device comprising electrical activity monitoring apparatus according to the fourth aspect of the invention.

In an embodiment, the reader module is configured to read signals from the at least one electrical activity sensor in response to a detected change in power consumption measured by an electricity meter connected to the power supply network.

In an embodiment, a communication network interface is provided for connecting with a communication network such that data may be transmitted to or received from a remote server connected to the communication network.

In an embodiment the reader module is configured to trigger the transmission of one or more interrogation signals in response to a command signal received via the communication network.

In an embodiment the electrical activity monitoring system further includes an electricity meter connected to the electrical activity monitoring apparatus for monitoring electrical power consumption in the power supply network.

In an embodiment the reader module is configured to transmit interrogation signal to the electrical activity sensor devices in response to a detected change in power consumption measured by the electricity meter.

In some embodiments of the invention timing means are provided to determine how long an electrical appliance has been switched ON or switched OFF.

A further aspect of the invention relates to an electrical activity monitoring apparatus for monitoring the electrical power status of at least one electrical device connected to a power supply network by a respective power cable and, the electrical activity monitoring apparatus comprising:

an RFID reader module for reading RFID data from at least one RFID tag device, each RFID tag device being attached to a respective power cable of an electrical device wherein the RFID data is received from the respective RFID tag via wireless transmission from a dipole type antenna magnetically coupled to an antenna of the RFID tag device and the RFID data is representative of electrical power status change of the electrical device; and a monitor device for determining from the RFID data received by the RFID reader module, which electrical devices of the network have changed electrical power status.

According to a further aspect of the invention there is provided an electrical activity monitoring system comprising at least one electrical activity sensor according to any embodiment of the first aspect or second aspect of the invention for monitoring the electrical status of an electrical device, and an electrical activity monitoring apparatus according to any embodiment of the second aspect of the invention.

According to a further aspect of the invention there is provided an antenna assembly attachable to a power cable of an electrical device for harvesting electrical energy from the power cable, the antenna assembly includes ab antenna element formed in a plurality of loops and, operable to magnetically couple with an electrical pulse generated in the power cable to harvest the electrical energy.

The harvested energy may be used to power up various-type of battery-less sensors that could be attached to the cables of the home powerline. The coupler may be provided on adhesive film to be wrapped around the power cord.

The antenna assembly may further comprise at least one dipole type antenna configured operate as a half wave dipole in the operating frequency range of the antenna element and to magnetically couple to the antenna element wherein the dipole type conductor is operable to wirelessly transmit data representative of the power state change of the electrical device from the antenna assembly to a remote reader, such as an RFID reader.

Some processes implemented by elements of the invention may be computer implemented. Accordingly, such elements may take the form of an entirely hardware embodiment, an entirely software embodiment (including firmware, resident software, micro-code, etc.) or an embodiment combining software and hardware aspects that may all generally be referred to herein as a "circuit", "module" or "system'. Furthermore, such elements may take the form of a computer program product embodied in any tangible medium of expression having computer usable program code embodied in the medium.

Since elements of the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which:

FIG. 6A is a schematic diagram of an electrical activity sensor device in accordance with a first embodiment of the invention;

FIG. 6B is a schematic diagram of the electrical activity sensor device of FIG. 2A mounted on a power cable;

FIG. 13 is a schematic diagram of an electrical activity sensor device in accordance with a second embodiment of the invention;

FIG. 14 is a schematic diagram of an electrical activity sensor device in accordance with a third embodiment of the invention;

FIG. 15 is a schematic diagram of an electrical activity sensor device in accordance with a fourth embodiment of the invention;

FIG. 16 is a schematic diagram of an electrical activity sensor device in accordance with a fifth embodiment of the invention;

FIG. 17 is a schematic diagram of an electrical activity sensor device in accordance with a further embodiment of the invention;

FIGS. 20A and 20B illustrate a power cable according to further embodiments of the invention;

DETAILED DESCRIPTION

Figure 1:
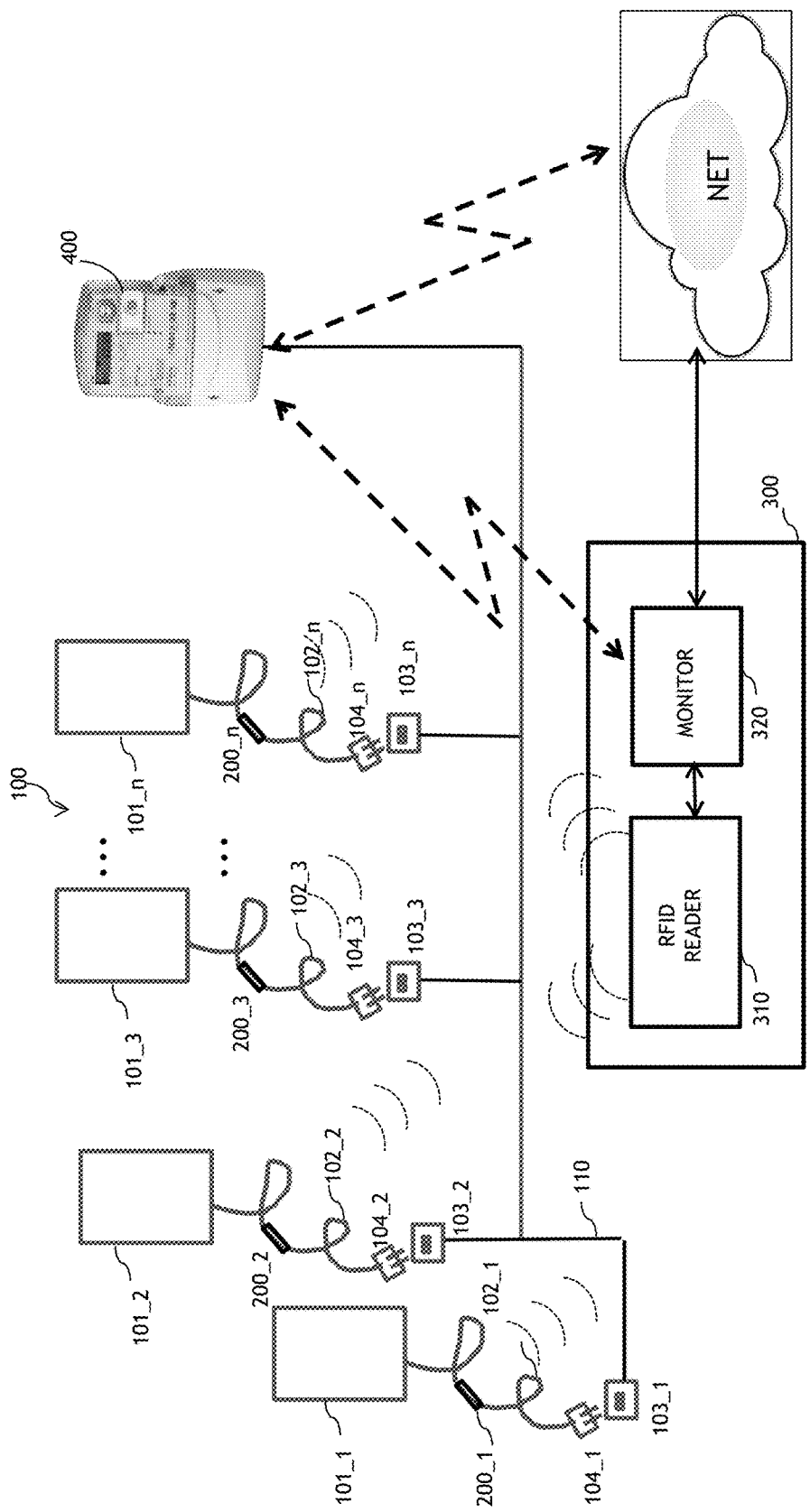
FIG. 1 is a schematic block diagram of an electrical activity monitoring system in which one or more embodiments of the invention may be implemented.

FIG. 1 is a schematic block diagram of an electrical activity monitoring system in which one or more embodiments of the invention may be implemented. The electrical activity monitoring system 100 monitors the change in electrical status of n electrical devices 101_1 to 101_n. Each electrical device 101_1 to 101_n is connected by means of a respective electrical power cable 102_1 to 102_n to a power outlet 103_1 to 103_n of an electrical power supply network 110. It will be appreciated that while in the illustrated embodiment of FIG. 1 each electrical device 101_1 to 101_n is connected to a respective power outlet 103_1 to 103_n, in other embodiments of the invention a plurality of electrical devices may be connected to the same power outlet 103_x.

Each electrical power cable 102_1 to 102_n is provided with a respective plug 104_1 to 104_n for connecting the respective electrical power cable to a respective power outlet 103_1 to 103_n for connection to the power supply network 110.

Each electrical power cable 102_1 to 102_n is further provided with a respective electrical activity sensor 200_1 to 200_n. Each electrical activity sensor 200_1 to 200_n is attached to a respective power cable 102_1 to 102_n. The electrical activity sensor 200_1 to 200_n comprises an antenna assembly, comprising an antenna element shaped in a plurality of loops in accordance with embodiments of the invention, for detecting an electrical signal generated in the respective power cable when the respective electrical device is switched ON or OFF, by magnetic coupling to the generated electrical signal.

The electrical activity monitoring system 100 further includes an electrical activity monitoring apparatus 300. The power supply network 110 is typically provided with an electricity meter 400 for measuring electrical consumption in the power supply network 110. The electrical activity monitoring apparatus 300 may be connected to a communication network NET such as an Internet network so that data on the electrical activity of the system may be transmitted to a remote monitoring device The remote monitoring device may be a remote electrical activity monitoring device for example the server of a remote electrical activity monitoring service or an electricity power supplier company.

Figure 2A:
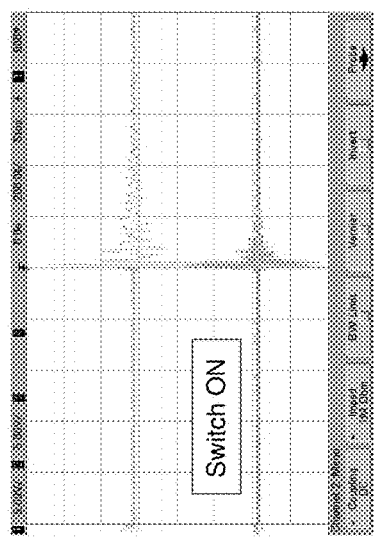
FIGS. 2A and 2B graphically illustrate examples of electrical signals measured in a power cable in response to a change in electrical power state.
Figure 2B:
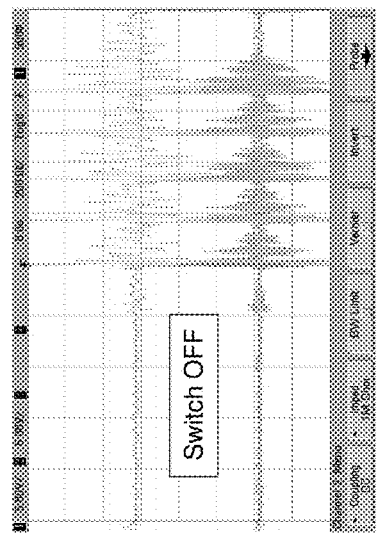

FIGS. 2A and 2B graphically illustrate examples of electrical pulses responses generated at different locations along the power cord of a lamp when the lamp is switched ON (FIG. 2A) and when the lamp is switched OFF (FIG. 2B). The electrical impulse appearing in the power cord at switch ON or switch OFF is also referred to as transient electrical noise and known for its undesirable effect on AM radio and gives rise to damped oscillatory current/voltage with amplitude and frequency depending on a number of parameters, including for example the distributed and lumped loads and the switching instant. Consequently it can be seen that the amplitude of the generated electrical pulses can vary over a wide range of values. It is desirable, in order to not miss any switch ON or OFF of an electrical device, to be able to ensure impulse detection even for low amplitude pulses.

The coupling of a current impulse to a miniature wire loop of an electrical activity sensor 200_x obeys Faraday's Law of induction. i.e. the rate of change in time of the flux of the magnetic field generated by the impulse current, induces an electromotive force at the inputs of the wire loop of the miniature electrical sensor device wrapped around the power cord. The electromotive force is at the source of the induced current in the loop.

Figure 3A:
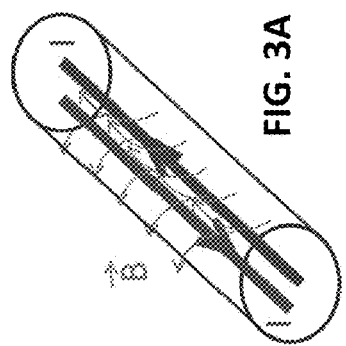
FIG. 3A schematically illustrate the generation of magnetic fields in a power cord.
Figure 3B:
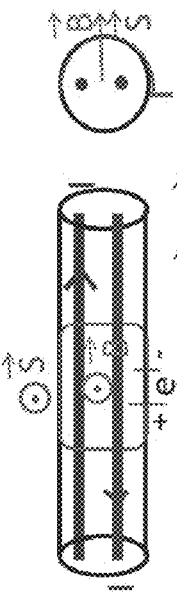
FIG. 3B and FIG. 3C schematically illustrate the induction of the electromotive force along a wire loop antenna by the magnetic field generated by a power cord (Faraday's law of induction)

FIG. 3A schematically illustrates a magnetic field generated by a power cord having two current carrying wires. It may be shown that the magnitude B of the magnetic field between the 2 wires is equal to:

$$B = 2\mu_0 I/\pi d;$$

where d corresponds to the distance between the 2 wires, each wire being considered to be of infinite length. With reference to FIG. 3B schematically illustrating Faraday's law for a power cord coupled to a wire loop of the electrical activity sensor the flux $\Phi$ of the magnetic flux through the wire loop of surface S is equal to:

$$\Phi = \vec{B} \times \vec{S}$$

where, x denotes the scalar product The electromotive force e, is then equal to:

$$e = d\Phi/dt$$

It may be deduced that the electromotive force "e" is maximum (i.e. the coupling of the miniature loop tag to the generated current impulse in the power cord is maximum) when the surface of the loop is maximum and the surface vector is collinear with the magnetic field generated by the power cord.

The antenna element of the electrical activity sensor may form part of an RFID tag. Operation of an RFID tag at UHF frequency, may impose some constraints. Indeed, the maximum power transfer from the antenna of an RFID tag to the RFID chip of the RFID tag requires that the real and imaginary part of the antenna impedance Za, seen from the edges of the loop, is equal to the conjugate of the IC chip impedance (perfect matching condition). This implies that the impedance of a wire loop antenna of the RFID tag which is inductive should be almost equal to the opposite of the imaginary part of the RFID chip impedance (which is capacitive). This constraint fixes the length of the wire loop which leads to a loop side (considered to be of square shape) greater than the half of the perimeter of the cross section of typical power cords.

Figure 3C:
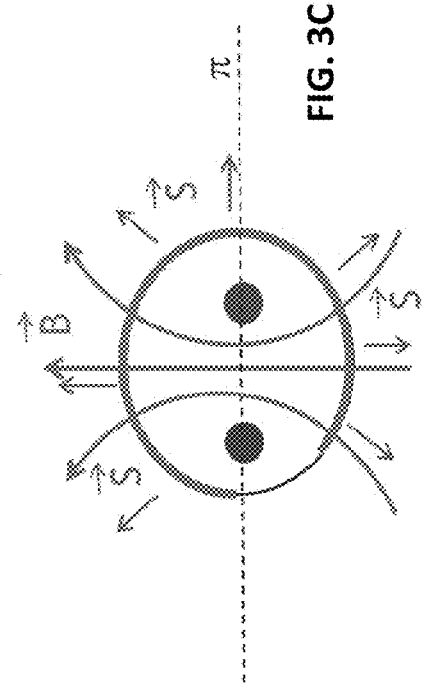

Therefore, as illustrated in FIG. 3C, when the side of a wire loop antenna (considered to be of square shape) is greater than the half of the perimeter of the power cord (considered to be of circular section), the magnetic flux contributions above and below a median plan π have opposite signs and partly cancel each other, thus limiting the coupling of the impulse current to wire loop.

Modifying the shape of a loop antenna, by choosing for example a rectangular loop, in order to maintain the small side above the π plan is not optimum from 1/ the coupling point of view, because it reduces the surface of the loop (the perimeter of the loop is imposed by the chip matching condition), 2/ It degrades the coupling of the miniature wire loop tag to the half wave dipole at UHF frequency.

Embodiments of the invention set out to provide a configuration of an antenna for an electrical activity sensor which enables increased coupling with an electrical impulse which is less influenced by the cross section of the power cord, while at the same time ensuring efficient transfer of the power from the RFID wire loop antenna to the RFID chip at the UHF operating frequency of an RFID tag comprising the antenna element.

Figures 4A, 4B:
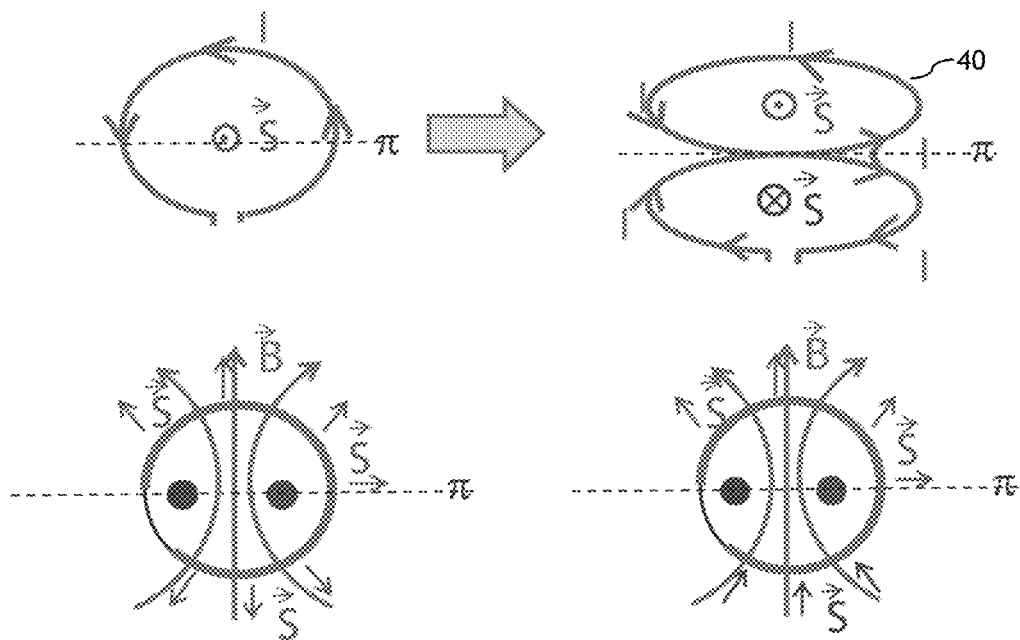
FIGS. 4A and 4B schematically illustrate generated magnetic field for different configurations of a wire loop antenna.

The configuration of an antenna element for an electrical activity sensor device 200_x in accordance with a first embodiment of the invention is schematically illustrated in FIG. 4B. The antenna element comprises a coupling loop 40 generally formed in the shape of the figure "8". The surface vector orientation given by the current direction in the arrangement of loops of the 8 shaped antenna element is considered. In a simple loop case as illustrated in FIG. 4A the magnetic flux contributions above and below a median plan π have opposite signs and partly cancel each other. In the case of shaping the antenna element loop in the general form of an "8" as illustrated in FIG. 4B, by virtue of the current direction change in the bottom half-loop the magnetic flux contributions above and below the median plan have the same sign and add constructively thus re-enforcing the coupling to the current impulse in the power cord 102_x when the respective electrical device 101_1 is switched ON or OFF.

Figures 5A, 5B, 5C:
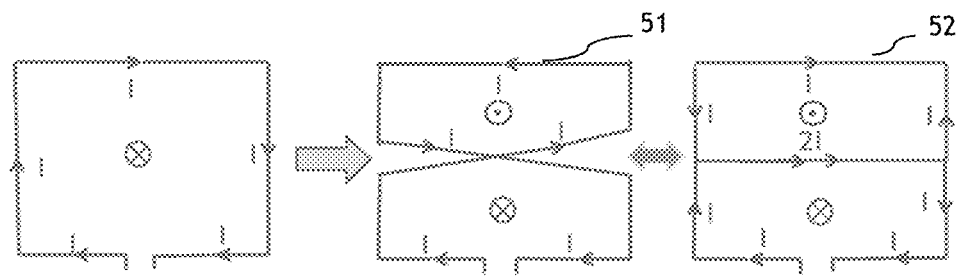
FIG. 5A to 5C schematically illustrate different configurations of a wire loop antenna according to embodiments of the invention.

FIG. 5A illustrates an antenna element formed in a simple loop shape. FIGS. 5B and 5C schematically illustrate antenna elements for electrical activity sensors according to embodiments of the invention each comprising a wire loop formed in a general shape of the Figure 8.

FIG. 6A schematically illustrates an electrical activity sensor in accordance with an embodiment of the invention. The electrical activity sensor comprises an antenna assembly 600 including an RFID sensor 601 and a dipole type antenna 650 provided on a flexible substrate 680. The antenna assembly 600 may, for example be etched on the flexible support layer 680. The flexible support layer 680 may for example be a thin Polystyrene adhesive film.

Figure 8A:
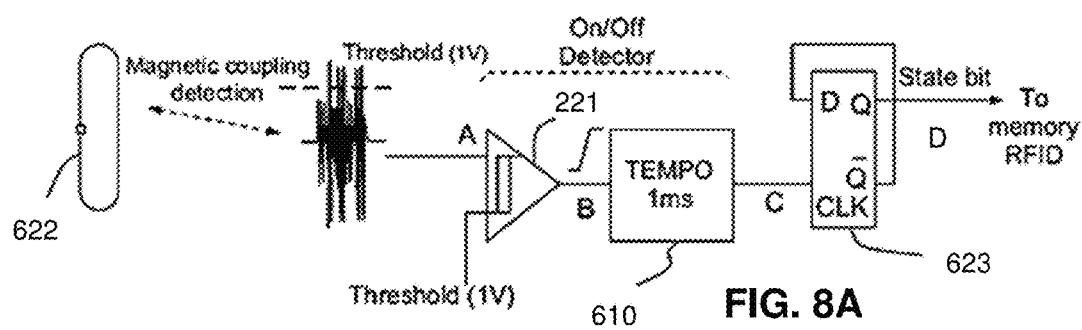
FIG. 8A is a block functional diagram of elements of a RFID sensor device in accordance with an embodiment of the invention.
Figure 8B:
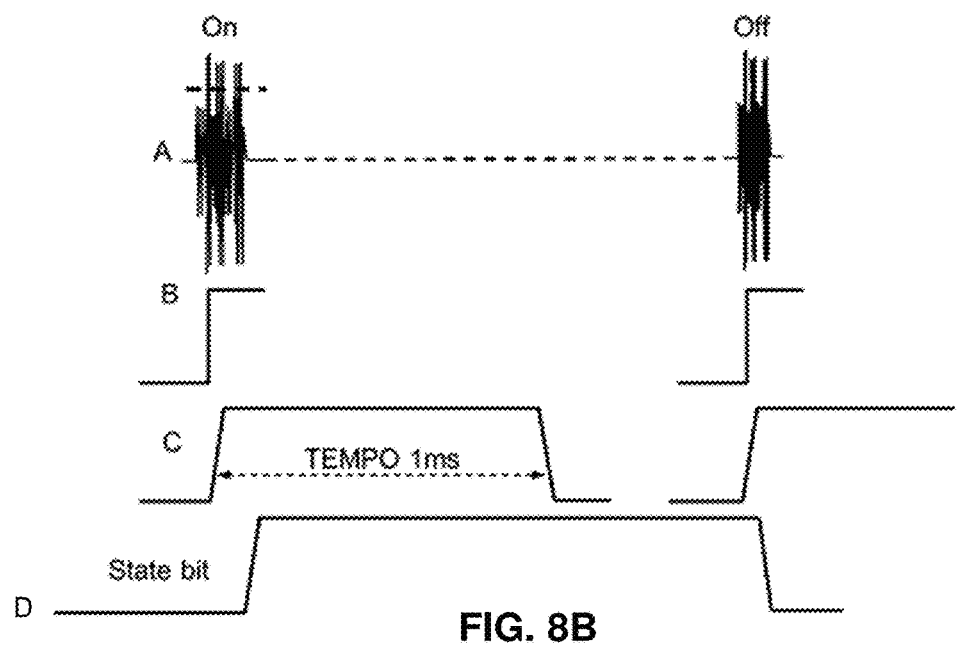
FIG. 8B is a graphical diagram illustrating a signal processing process implemented by an RFID sensor in accordance with an embodiment of the invention.

With reference to FIG. 6A an electrical activity sensor (200_x) 601 in accordance with an embodiment of the invention comprises a loop antenna 610 in the general shape of the figure 8 and a signal processing circuit 602. With reference to FIG. 6C the signal processing circuit 602 is provided with a pulse detection module 620 and a memory chip 630 for storing data representative of an electrical status change and/or identification data identifying the electrical activity sensor 601. Each electrical activity sensor device 200_x in the electrical monitoring system 100 may be provided with an identification code enabling it to be identified by the monitoring device 300. The electrical activity sensor may comprise an RFID tag provided with an RFID circuit. An RFID tag may also be referred to as an RFID sensor, an RFID label, an RFID transponder and the like.

The RFID tag 601 may for example be a near field/short range RFID tag operating in the UHF frequency band, for example in the range from 800 MHz to 960 MHz, such as the region of 860 MHz or 900 MHz, or in the region of 433 MHz; or operating in the HF frequency band, for example in the region of 13.6 MHz.

RFID may be considered as a non-specific short range device. It can use frequency bands without a license. Nevertheless, RFID should typically be compliant with local regulations (ETSI, FCC etc.)

LF: 125 kHz-134.2 kHz: low frequencies,
HF: 13.56 MHz: high frequencies,
UHF: 860 MHz-960 MHz: ultra high frequencies,
SHF: 2.45 GHz: super high frequencies The loop antenna 610 of the RFID sensor device 601 has a dual function. Firstly, the antenna 610 of an RFID sensor device 200_x is used to detect by magnetic coupling the electrical pulse generated in the respective power cable 102_x when the corresponding electrical device 101_x undergoes a change in electrical power state, for example is switched ON or switched OFF. Indeed, the generated electrical pulse results from the change in power state of the respective electrical device 101_x. As explained with reference to FIGS. 2A and 2B when an electrical device 101_x is switched ON or OFF, a current pulse flows in its respective power cable 102_x. The loop antenna 610 of the respective RFID sensor device 200_x attached to the power cable 102_x couples magnetically to the current pulse generating an electrical pulse which can be detected by the pulse detection module 620. The electric state change is stored in the RFID chip memory 630. The second function of the antenna 610 is to electromagnetically couple the dipole-type antenna 650 to the RFID circuit 602.

The role of the dipole type antenna 650 is to wirelessly transmit data from the RFID circuit to an RFID reader. The dipole type antenna 650 comprises a half-wave length dipole-type conductor having a length L, sized, to operate in the RF operating frequency range of the RFID sensor 601. The dipole type antenna 650 behaves as an efficient half-wave dipole at the operational frequency of the RFID sensor.

FIG. 6B schematically illustrates the antenna assembly of FIG. 6A attached to the power cable 102 of an electrical device 101.

The power cable 102 comprises an insulating sheath 612 enclosing a plurality of conducting wires W for providing power from the power supply network 110 to the corresponding electrical device 101.

The flexible substrate 680 is wrapped at least partially around the power cable 102 and adheres by means of adhesive to the insulating sheath 612. The loop antenna 610 of the RFID sensor is wrapped at least partially around the power cable 102. The dipole type antenna 650 extends along the power cable 102, with part of the dipole antenna 650 extending between opposing ends of the loop antenna 610 wrapped around the power cable 602 to enable magnetic coupling between the loop antenna 610 and the dipole type antenna 650.

In order to enable the maximum transfer of RF energy between the RFID sensor 601 and the dipole type antenna 650, the half-wave dipole of the dipole like antenna 650 is magnetically coupled to the loop antenna 610 of the RFID sensor 601 in an impedance plane of the resonating dipole for which the radiation impedance of the half-wave dipole 650 (in presence of the power cable wires) transformed through the wire loop is almost equal to the real part of the RFID circuit 620. In this way the dipole-type antenna 650 coupled to the loop antenna 610 behaves as an efficient half-wave dipole at the operating frequency of the RFID sensor 601 despite the very close proximity of the wires W of the power cable 102.

Figure 7:
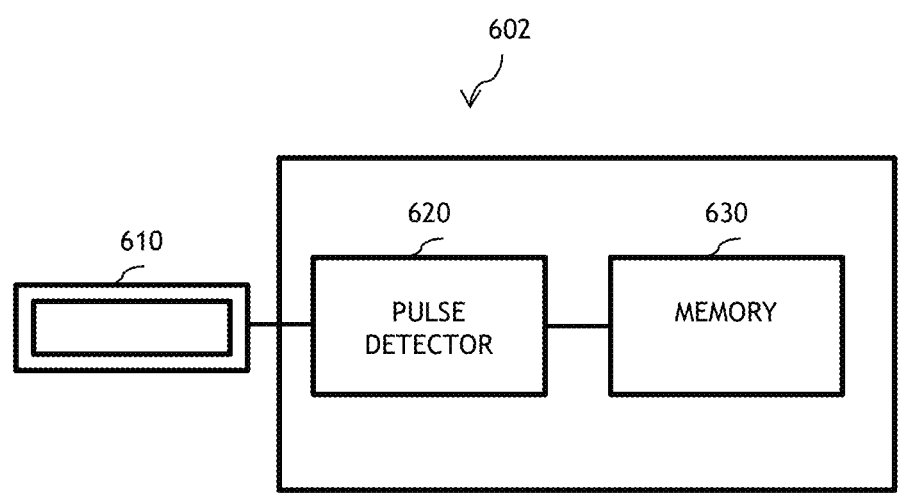
FIG. 7 is a block diagram of an antenna sensor device in accordance with an embodiment of the invention.

FIG. 8A is a schematic diagram illustrating an example of operation of the pulse detection module 620 of the RFID sensor 601. When the electrical power state of an electrical device changes, for example by being switched ON or OFF, a corresponding power state change pulse signal A is picked up by the loop antenna 610, by means of a magnetic coupling effect. When the amplitude of the power state change pulse signal A exceeds a predetermined threshold (1V for example), a block comparator 621 detects an input pulse signal and in response changes the state of the output signal B. In order to avoid multi triggering, a temporization device 622 may be connected to the output of the comparator 621 to provide a signal C at its output which corresponds to the signal issued from the comparator during a set temporization time. A D flip flop module 623 generates a state bit D. The state bit D is changed for each clocked impulse since the D Flip Flop module 623 is clocked by the output signal C of the temporization module 622. Consequently the last bit of bit signal D changes state at each detected pulse (at switch on or off). The state can thus be used to indicate an electrical power state change. The bit value is stored in the memory chip 630 of the RFID sensor device 601. This information representative of a change of electrical power state of respective electrical device 101_x can then be transmitted with the identification code ID RFID sensor device 200 to the monitoring device 300 by the antenna assembly 200. An example of signals A, B, C and D of the operation of FIG. 7A are graphically represented in FIG. 7B.

In particular embodiments of the invention by knowing the initial electrical power state of the electrical device 101_x at counter reset, it is possible to determine from the state of bit signal D whether the electrical change corresponds to an ON/OFF electrical status change or an OFF/ON electrical status change. Moreover, by knowing the ON or OFF power state of the electrical device at the previous reading the ON or OFF power state at the subsequent reading can be deduced.

When activated by an electrical power state change, the loop antenna 610 of the RFID sensor 601 transfers data indicative of an electrical state change from the memory chip 622 to the dipole-type antenna 650 and the data is transmitted wirelessly from the electrical activity sensor 200 to the RFID reader 310 of the monitoring device 300 by the radiating dipole type antenna 650.

Data representative of the electrical state change may be transferred by the electrical activity sensor 200 to the RFID reader 310, for example at each interrogation by the RFID reader operating in the RFID frequency band.

In the case where the RFID sensor 601 is a passive type RFID tag the antenna loop 610 acts as a power-coupling inductor which can harvest electrical power from the coupling between the loop antenna 610 and the electrical pulse generated in the power cable 102 to operate the modules of the RFID sensor device 200, such as the memory chip 630 and the pulse detection module 620. Since the RFID sensor 601 in such an embodiment is a passive RFID tag device, energy consumption can be minimized since power is not being supplied constantly to the RFID sensor 601 from a power supply such as a battery. It will be appreciated, however, that in alternative embodiments of the invention the RFID sensor 601 may be an active type RFID tag powered by its own power supply means or a battery assisted passive type RFID tag.

The electrical activity sensor 200 may be attached to the respective power cable 102_x by any form of fixation means such as for example by adhesive such as glue, sticking tape, or a sticker, by a mechanical connection such as for example staples, screws, nails; or by being embedded in the insulating sheath cover 612 of the respective power cable 102_x.

For proper matching of the RFID circuit chip 602 at the operating UHF frequency, the inductance seen by the RFID circuit 602 at the resonant frequency of an antenna element in the form of the figure 8 should similar to that of an antenna element formed as a simple loop to, and equal to the opposite of the reactance of the RFID circuit chip 602 in order to cancel the chip capacitive impedance.

Figure 9A:
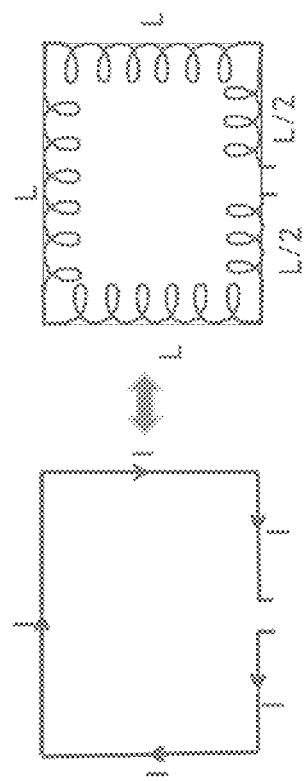
FIGS. 9A and 9B schematically illustrate the calculation of the equivalent inductance of the wire loop antenna for different configurations of a wire loop antenna according to embodiments of the invention.
Figure 9B:
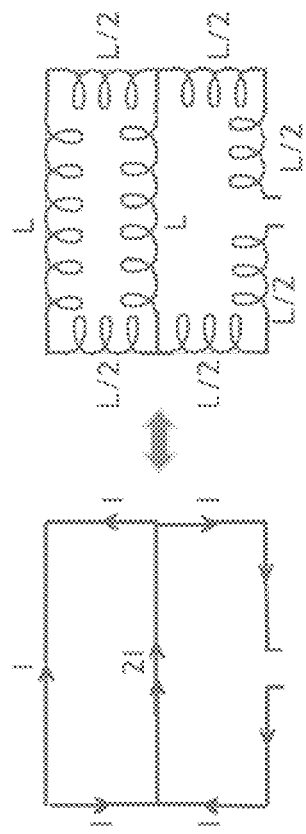

FIGS. 9A and 9B schematically illustrate inductance models for a simple square loop and an eight shaped loop antenna element respectively. The side value inductance of the square loop is considered to be equal to L, and the equivalent reactance of the square loop is equal to 4L (=L/2+L+L+L/2). The reactance of an antenna element formed as a plurality of loops in the shape of the figure 8 eight shaped loop, considered to have the same area as the square loop, is equal to 8/3L [=L+(L//2L)+L)=L+2/3 L+L=8/3 L]. Hence:

$$L_{square} = 4L = 3/2 \times 8/3L = 3/2 \times L_{eight}$$

Therefore, in FIG. 9B since the reactance value of line segment is proportional to its length, in order to maintain the same reactance value as for the square loop (required for chip matching) of FIG. 9A the length of the segments of the eight shaped loop are multiplied by a factor of 3/2=1.5. By doing so the total surface of the eight loop compared to the square loop is increased by a factor (1.5)2=2.25, thus increasing the flux of the magnetic field and the impulse coupling by the same factor. This leads to enhanced impulse coupling between the electrical activity sensor and the electrical pulse generated in the power cable of the respective electrical device. Comparative measurements show that the magnitude of the coupled current impulse may be multiplied by a factor 1.4 when an "8" shaped loop is used compared to a simple shaped loop. After re-sizing the novel miniature wire-loop tag as for example illustrated in FIG. 10, a total improvement of the coupling by a factor of 3.15 (3.15=2.25×1.4) can be obtained.

Figure 10A:
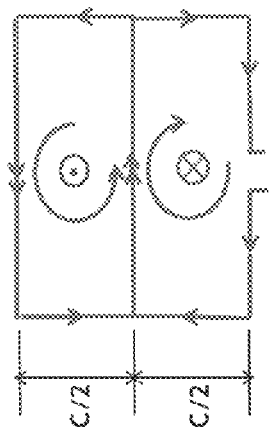
FIGS. 10A and 10B schematically illustrate different configurations of a wire loop antenna according to embodiments of the invention for different section sizes of the cable FIGS. 11A to 11C schematically illustrate different configurations of a wire loop antenna according to embodiments of the invention.
Figure 10B:
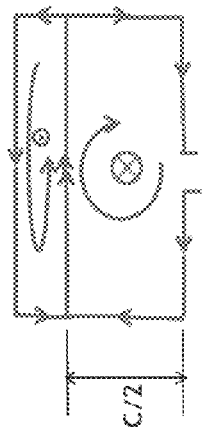

Improved coupling is obtained when the eight shaped wire loop of the antenna element is sized as shown in FIG. 10A, where C denotes the circumference of the power cord. If the length of the side of the antenna element is not a multiple of C/2, the coupling loop may be sized as shown in FIG. 10B.

It will be appreciated that the shape of the coupling loops may be square, rectangular, circular, elliptical, polygonal etc. In addition the wire loop may be provided with any number of loops greater than or equal to two as illustrated for example in FIGS. 11A to 11C.

Figure 12A:
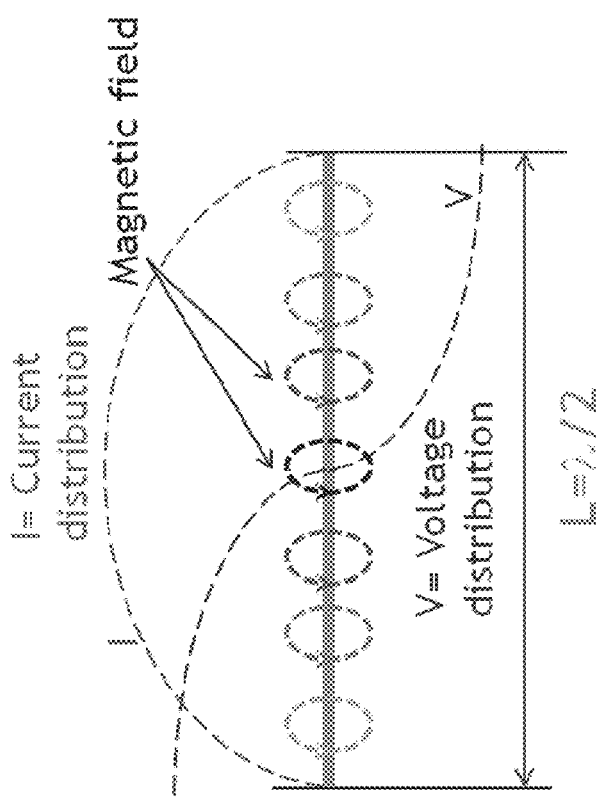
FIG. 12A graphically illustrates current voltage and magnetic field distributions along a half-wave dipole.
Figure 12B:
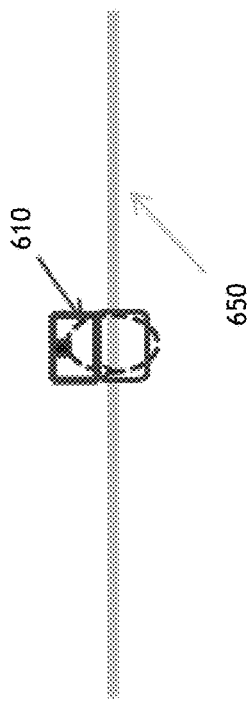
FIG. 12B schematically illustrates an arrangement of a half-wave dipole and a loop antenna.
Figure 18:
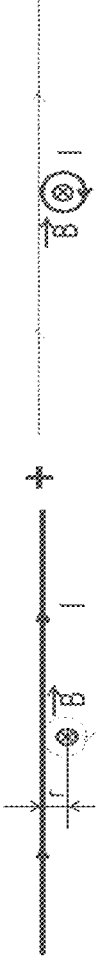
FIG. 18 is a schematic diagram illustrating the magnetic field generated by a circular wire loop in a wire of a power cable in accordance with embodiments of the invention.

FIG. 12A graphically illustrates current and voltage distributions along a half-wave dipole and the corresponding magnetic field. The magnetic field is maximum at the middle of the dipole and minimum at the edges. Thus, when in free space, the optimum magnetic coupling of the dipole type antenna 650 to the loop antenna 610 of the RFID sensor 601 would be obtained at the center of the dipole as illustrated in FIG. 12B. The inductive coupling between the loop antenna 210 and the resonant dipole type antenna 650 may be modeled, for example by a transformer with a mutual inductance of M. In this way the input impedance of the antenna assembly $Z_a$ at the edges of the loop may be expressed as:

$$Z_a = R_a + j X_a = Z_{loop} + (\omega M)^2 / Z_r \quad (1)$$

where: $\omega = 2\pi f$; f=resonant frequency; $R_a$ and $X_a$ represent the real and imaginary parts of the input impedance of the antenna assembly 200, $Z_{loop}$ represents the impedance of the loop antenna 610 which is mainly inductive and generally equal to the loop inductance at the resonant frequency, $Z_r$ is the dipole radiation resistance of a symmetrical dipole (i.e. dipole excited at its center).

For optimal matching to the impedance of the RFID circuit 602, the real and imaginary part of the input impedance of the antenna assembly 600 should be the conjugate of the impedance of the RFID circuit 602. For example, a typical input impedance of an RFID circuit is equivalent to an RC parallel circuit with R≈1 to 2 kΩ and C≈1 to 2 pF, giving typical values of $R_a$≈10Ω and $X_a$≈−100Ω at an operating frequency of 900 MHz. Thus, in this example the size of the loop antenna 610 and the distance between the loop antenna 610 and the dipole type antenna 650 may be adjusted so that $Z_a = R_a + jX_a$ is approximately equal to 10Ω+j×100Ω at 900 MHz.

In order to better match the input impedance of the antennas of the antenna assembly to the RFID circuit, the real part of the input impedance of the antenna assembly should be significantly reduced. With reference to equation (1) that means that the radiation resistance Zr of the dipole type antenna should be significantly increased.

Knowing that the radiation resistance Zr of a half-wave dipole driven at a distance x from its end is expressed as:

$$Zr = R0/\sin^2(2\pi x/\lambda);$$

where:
R0=radiation resistance when the dipole is driven at its center; theoretically equal to 73Ω for an infinitely thin dipole
λ=wavelength at resonant frequency The idea is to adjust the radiation resistance Zr of the dipole type antenna 650 to any arbitrary value greater than 73Ω by moving the driving point position corresponding to position of the coupling with the loop antenna 610 from the center of the dipole type antenna 650 towards one end of the dipole type antenna 650 as illustrated in FIGS. 6A and 6B.

Accordingly based on the above observations in embodiments of the invention the loop antenna 610 is coupled to the dipole type antenna 250 at coupling position located at a distance x from the end of the dipole type antenna 650 based upon the input impedance of the RFID circuit 602. In this way the dipole-type conductor 650 coupled to the loop antenna 610 behaves as an efficient half-wave dipole at the UHF working frequency) despite the very close proximity of the 2 or 3 wires of the power supply.

In a preferred embodiment the loop antenna 610 is coupled to the dipole type antenna 650 at a distance x from the end of the dipole conductor 650 so that the input impedance of the antenna assembly matches the input impedance of the RFID circuit 620. In particular the loop antenna 610 is coupled to the dipole type antenna 650 at a distance x from the end of the dipole conductor 650 based upon the radiation resistance of the dipole conductor 650. Preferably the loop antenna is coupled to the dipole at a coupling position located a distance x from the end of the dipole conductor to increase the radiation resistance Zr of the dipole conductor 650.

FIG. 13 schematically illustrates an electrical activity sensor 800 in accordance with a second embodiment of the invention. The electrical activity sensor 800 comprises an RFID sensor 801 comprising a wire loop antenna element having a plurality of loops arranged in the form of the figure 8 and a dipole type antenna 850 operating in a similar manner to the RFID sensor 201 and the dipole type antenna 650 of the first embodiment of the invention. In the second embodiment the dipole type antenna 850 has a helical shape, in particular with a sizing providing a single turn helix when wrapped around the respective power cable 102. In this embodiment the symmetry of the radiation pattern of the dipole type antenna is improved.

FIG. 14 schematically illustrates an electrical activity sensor 1100 in accordance with a third embodiment of the invention. The electrical activity sensor 1100 comprises an RFID sensor 1101 operating in a similar manner to the RFID sensor 201 of the first embodiment and a plurality of dipole type antennas 1151, 1152 operating in a similar manner to the dipole type antenna 650 of the first embodiment of the invention. In the fifth embodiment two dipole type antennas 1151 and 1152 are provided, with a dipole type antenna being arranged on each side of the loop antenna 1110 of the RFID sensor 1101. The two dipole type antennas 1151 and 1152 each have a helical shape, in particular with a sizing providing a single turn helix when wrapped around the respective power cable 102. The two dipole type antennas 1151 and 1152 are arranged to extend parallel to one another and to overlap along most of their length.

In further embodiments of the invention the dipole type antenna may be formed as a dipole conductor with at least one fold. The radiation resistance of a folded dipole is greater than the radiation resistance of a classical half-wave dipole, Depending on the folding configuration the radiation resistance may be four times that of a classical half-wave dipole. That helps to increase the dipole radiation resistance in the presence of the power cable to improve the coupling. For example FIG. 15 schematically illustrates an electrical activity sensor 1200 in accordance with a fourth embodiment of the invention. The antenna assembly 1200 comprises an RFID sensor 1201 operating in a similar manner to the RFID sensor 201 of the first embodiment and a dipole type antenna 1250 operating in a similar manner to the dipole type antenna 650 of the first embodiment of the invention. In the sixth embodiment the dipole type antenna 1250 is folded into a rectangular like shape and arranged alongside the loop antenna 1210 of the RFID sensor 1201.

FIG. 16 schematically illustrates an electrical activity sensor 1300 in accordance with a fifth embodiment of the invention. The electrical activity sensor 1300 comprises an RFID sensor 1301 operating in a similar manner to the RFID sensor 601 of the first embodiment and a dipole type antenna 1350 operating in a similar manner to the dipole type antenna 650 of the first embodiment of the invention. In the seventh embodiment the dipole type antenna 1350 extends along the power cable with part of the dipole type antenna being arranged around three sides of the loop antenna 1310 of the RFID sensor 1301. This increases the coupling between the loop antenna 1310 and the dipole type antenna 1350.

Figure 19B:
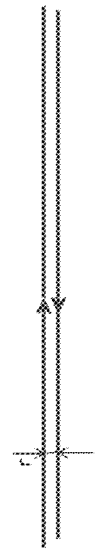
FIGS. 19A and 19B is a schematic diagram illustrating the magnetic field generated by a circular wire loop in a wire of a power cable in accordance with embodiments of the invention.
Figure 19A:
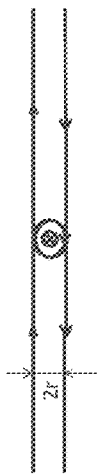

FIG. 17 schematically illustrates an electrical activity sensor in accordance with a further embodiment of the invention. The electrical activity sensor comprises a power cord 1920 and an antenna element in the form of a wire loop 1910 for coupling with the electrical pulse generated in the power cord 1920 in response to the switching ON or OFF of the electrical device to which the power cord is connected. The antenna element may be shaped as a simple wire loop or shaped as a plurality of loops, for example in the shape of the figure 8. In this embodiment the magnetic field of the power cord is boosted locally by giving a particular shape to each of the current carrying wires W1, W2 inside the power cord casing 1921. In particular, by shaping each wire to form one or more loops 1951, 1952, and positioning the loops 1951, 1952 of the two wires W1, W2 side by side so that the loops 1951, 1952 are generally parallel as illustrated in FIG. 17. This results in a flow of current in the same direction for the loops 1951, 1952 of each of the two wires W1, W2. This configuration of the current carrying wires W1, W2 is done at the location where the coupling device (i.e. an RFID tag comprising a wire loop antenna element formed in one or more loops) is placed along the power cord. This enables the total magnetic field generated by the electrical response signal in the power cord wires to be significantly increased. An estimation of the magnitude of the local magnetic field produced by the power cord configured as set out in FIG. 19 will be outlined in what follows.

In the calculation, the separation between the 2 wires W1, W2 being locally increased from r (in case of straight wires) to 2r (when formed to comprise a loop) is taken into account. With reference to FIG. 20, the total magnetic field $B_{total}$ produced at the center of the loop by one long straight wire (supposed infinitely long) including a circular loop of radius r with running current I, is the sum of the magnetic field produced by a long straight wire at a distance r ($B_{straight}=\mu_0 I/2\pi r$) and the magnetic field produced by a circular wire loop of radius r at its center ($B_{loop}=\mu_0 I/2r$). Both fields having the same direction. Thus:

$$B_{total}=B_{straight}+B_{loop}=\mu_0 I/2\pi r+\mu_0 I/2r=\mu_0 I/2r(1+1/\pi)$$

And for 2 wires separated by a distance of 2r (FIG. 21A):

$$B_{total}(\text{2wires with loops})=2\times[\mu_0 I/2r(1+1/\pi)]=\mu_0 I/r(1+1/\pi)$$

In comparison, the total B field of 2 straight wires separated by a distance equal to r:

$$B_{total}(\text{2wires w/o loops})=2\times(\mu_0 I/2\pi r/2)=2\mu_0 I/\pi r$$

Therefore:

$$B_{total}(\text{2wires with loops})=\mu_0 I/r(1+1/\pi)=2\mu_0 I/\pi r\times\pi/2\times(1+1/\pi)=B_{total}(\text{2wires w/o loops})\times(\pi+1)/2$$

$$B_{total}(\text{2wires with loops})=(\pi+1)/2\times B_{total}(\text{2wires w/o loops})$$

It may be concluded, that the shaping of the current carrying wires W1, W2 as proposed in the present embodiment of the invention leads to a multiplication by a typical factor of 2 of the magnitude of the magnetic field generated by the power cord impulse, despite the local increased separation between of the 2 wires from r to 2r.

It will be appreciated that the shape of the loops formed in the wires of the power cable may be square, rectangular, circular, elliptical, polygonal etc. In addition two or more sets of wire loops may be formed along the length of the wire as illustrated in FIG. 20A or in a direction perpendicular to the length of the wire as illustrated in FIG. 20B. A combination of the configurations of FIGS. 20A and 20B may also be envisaged. Such configurations may further boost the local magnetic field. Moreover three or more wires in the power cord may so configured each to form one or more loops at a corresponding position.

Figure 21:
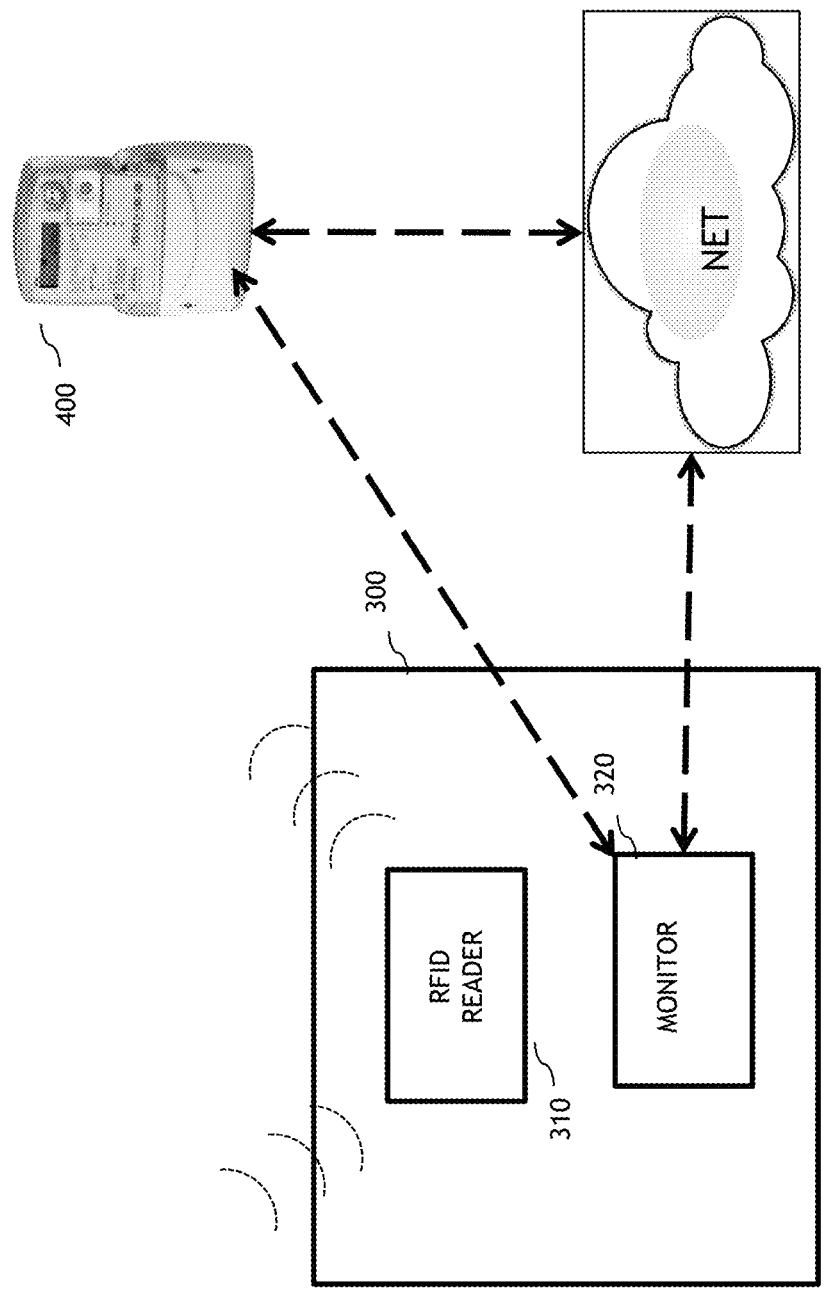
FIG. 21 is a schematic block diagram of an electrical activity monitoring apparatus in accordance with an embodiment of the invention.

FIG. 21 is a block diagram schematically illustrating an electrical activity monitoring apparatus 300 in accordance with an embodiment of the invention. The electrical activity monitoring apparatus 300 comprises an RFID reader device 310 and a monitoring device 320 for processing RFID data signals.

The RFID reader device 310 is a far field RFID type reader and is configured to wirelessly receive RFID data signals transmitted from the electrical activity sensors attached to the power cables 102 of the network via wireless transmission from the respective dipole type antenna 650 and to send RFID interrogation signals to the RFID sensors 200 via wireless transmission to the respective dipole type antennas 650.

Monitoring device 320 receives data from the RFID reader device 310 indicative of the electrical activity status of the electrical devices 101_1 to 101_n in the electrical activity monitoring system 100.

In one particular embodiment of the invention the monitoring device 320 is connected to a smart type electricity meter 400 connected to the power supply network 110 of the system. The electricity meter 400 and the monitoring 320 device may be connected by a wireless or wired connection. The smart electricity meter 400 is configured to monitor the power consumption of electrical devices 101_1 to 101_n connected to the power network 110. The smart electricity meter 400 is configured to detect a change in power consumption: for example an increase in the rate of power consumption which may result from the switching ON of one or more electrical devices 101_1 to 101_n supplied by the power network 110, or a decrease in the rate of power consumption which may result from the switching OFF or to STANDBY of one or more of the electrical devices 101_1 to 101_n supplied by the power network 110. In response to the detected change in power consumption a command signal is transmitted from the monitoring device 320 to the RFID reader device 310 to activate an RFID reading process. The RFID reader device 310 in response to the command signal transmits an interrogation signal to the RFID sensor devices 201_1 to 201_n in order to read the electrical status data stored in the respective RFID memory chips 230_1 to 230_n of the RFID sensor devices 201_1 to 201_n. The interrogation signal may be sent from the RFID reader 310 to one or more electrical activity sensors 200s by wireless transmission. Response signals are then transmitted by the electrical activity sensors 200_1 to 200_n towards the monitoring apparatus 300 by means of the respective dipole type antennas 250. The response signals from the RFID sensor devices 200_1 to 200_n each include the identification code of the respective electrical devices 102_1 to 102_n and the corresponding electrical power state change information stored in the respective RFID memory chip 230. The collected electrical power state change information signals are received and read by the RFID reader device 310. The processed electrical power state change activity information is then transmitted to the monitoring device 320.

Monitoring device 310 may further process the received power state change information or transfer the power state change information to another device, such as a remote device connected via a communication network.

For example, if an electrical device 101_x, for example a coffee machine, connected to a household power supply network 110 is switched ON (for example from an OFF power state or from a STANDBY mode):

1. The total power consumption will increase by an amount corresponding to the power consumed by the coffee machine. This change in power consumption will be measured by smart electricity meter 400.

2. The current impulse generated in the corresponding power cable in response to the switch on activates the corresponding RFID sensor device 201 attached to the respective power cable, and the status information change (OFF to ON) is stored in the RFID memory chip by switching a bit (the "state bit") from 0 (corresponding to OFF state) to 1 (corresponding to ON state)

The increase in power consumption measured by the smart electricity meter 400 may be detected by the monitoring device 320. In response to the detected increase a read command is sent to the RFID reader device 300 to trigger a read phase of the RFID reader device 310. The RFID reader module 310 reads all the RFID sensor devices 201_1 to 201_n of the electrical devices 101_1 to 101_n connected to the power network 110 by transmitting interrogation signals. The read information of each RFID sensor 201_1 and includes its identification and its electrical ON/OFF change status.

In some embodiments of the invention by comparing the electrical change status of all the RFID sensor devices read with the previous one stored in an electrical devices status dataset, at the previous reading phase, it is possible to infer which electrical device has been powered on and the electrical devices status dataset may be updated accordingly.

In other embodiments of the invention, the state of the respective state bit signal stored on the corresponding RFID memory chip can be used to identify which electrical device or devices have been switched on or off.

In some particular embodiments of the invention for an electrical device an electrical pulse generated by an ON to OFF or STANDBY electrical power state change, may be distinguished from an electrical pulse generated by an OFF or STANDBY to ON electrical power state change by characterizing the pulse signals. The impulse detector 220 of the RIFD sensor device 201 of such embodiments is configured to detect from the characteristics of the generated electrical pulse signal whether the electrical pulse results from an ON to OFF or STANDBY power state change or from an OFF or STANDBY to ON power state change.

In further embodiments the impulse detector may be configured to distinguish between an OFF to ON and a STANDBY to ON; and to distinguish between an ON to STANDBY and an ON to OFF, by characterizing the resulting pulse signals.

In another embodiment of the invention the power consumed by an electrical device 101_x may be determined, for example by detecting an OFF to ON power state change or a standby to ON power state change and then determining the duration of time for which the electrical device is placed in an ON state. Data representative of the power consumption may then be transferred from the corresponding RFID sensor device 200_x to the RFID reader device 300 by the antenna assembly in the same way as data representative of the electrical power state change is transmitted to the RFID reader device 300.

The electrical power state change data or consumption data may be processed to provide relevant information on electrical activity of the power network 110, such as for example to build a household user profile, to detect and warn of increased electrical power consumption, and/or to provide recommendations for reducing energy consumption In other embodiments of the invention, rather than sending an interrogation signal from the RFID reader to the RFID sensor devices in response to a command from the monitoring device 320 the RFID reader may send interrogation signals automatically to the RFID sensor devices without being commanded by the monitoring device; for example on a periodic basis.

In some embodiments of the system that monitoring device may be part of a home gateway system connected to an external internet network. Real time tracking of the total home power consumption could be provided by the home electricity provider via the internet network. For example the electricity provider could trigger reading phases of the RFID reader by transmitting signals from a remote server via the gateway device.

Figure 22:
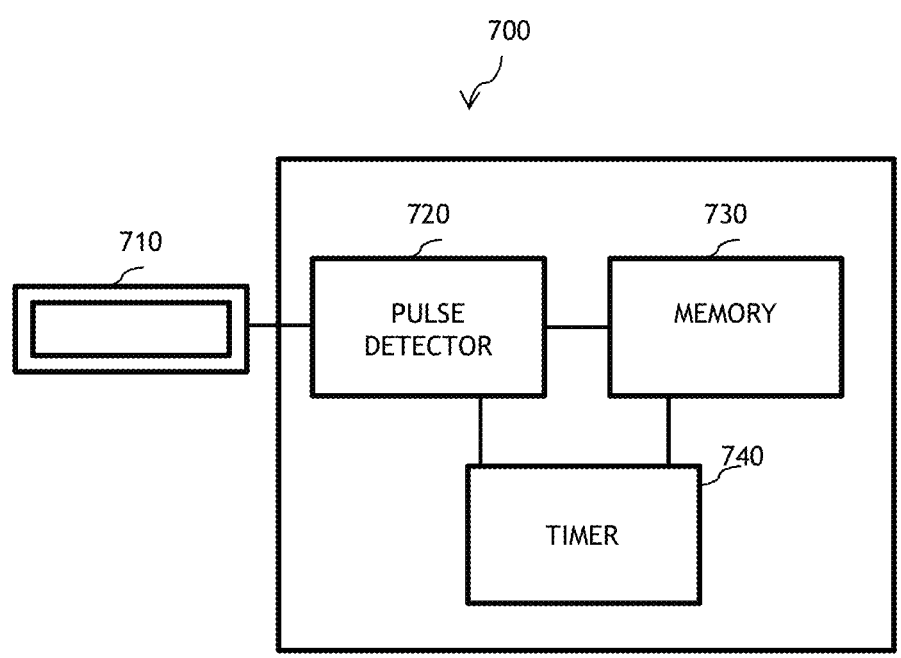
FIG. 22 is a schematic block diagram of an RFID sensor device in accordance with a further embodiment of the invention.

FIG. 22 is a schematic functional block diagram of an RFID sensor device 701 in accordance with a further embodiment of the invention.

The RFID sensor device 700 comprises a loop antenna 710, a pulse detection module 720 and a memory chip 730 for storing identification data of the RFID sensor and data representative of an electrical status change. These elements operate in a similar way to corresponding elements of the embodiment of FIG. 3. With respect to the embodiment of FIG. 7 the RFID sensor device 700 further includes a timer 740. The timer 740 is used to measure the duration of time for which the electrical device has been changed electrical state by measuring the amount of time from when a pulse was detected by the pulse detector 720. The time data may be stored in memory 730 and transmitted with the ID data and electrical status data to the RFID reader. The timing data enables the amount of time a device has been switched on or off to be determined.

Embodiments of the invention enable detection of electrical activity to be provided in a simplified and low cost manner.

Although the present invention has been described hereinabove with reference to specific embodiments, the present invention is not limited to the specific embodiments, and modifications will be apparent to a skilled person in the art which lie within the scope of the present invention.

For instance, while the foregoing examples have been described with respect to a household power network system, it will be appreciated that embodiments of the invention may be applied to any power network to which electrical devices are connected. Moreover the system could be applied in security or safety applications to identify electrical devices which have been switched on or switched off.

In addition while in the described embodiments of the invention data is transmitted from the electrical activity sensor by means of a dipole type antenna it will be appreciated that the presence of the dipole type antenna is not essential. Data may be transmitted directly by the RFID sensor to an RFID reader, or via the electrical power line to a reader interfaced with the power lines.

Moreover in further embodiments of the invention the antenna assembly may be used as an efficient inductive coupler for energy harvesting from powerline. The harvested energy could be used to power up various-type of batteryless sensors that could be attached to the cables of the home powerline. The coupler may realized on adhesive film to be wrapped around the power cord.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. An electrical activity sensor attachable to a power cable of an electrical device for detecting a signal generated in the power cable in response to a change in electrical power state of the electrical device, the electrical activity sensor comprising an antenna assembly including:
    an antenna element operable to magnetically couple with an electrical pulse generated in the power cable in response to a change in electrical power state of the electrical device to induce an electrical signal; wherein at least a part of the antenna element is formed in a plurality of loops for magnetic coupling with the electrical pulse in the power cable, wherein a size for the plurality of loops is based on a circumference of the power cable and wherein the side of each loop of the plurality of loops has an axial length less than half of the circumference of the power cable.

2. The electrical activity sensor according to claim 1 wherein the plurality of loops are configured to form the shape of a FIG. 8.

3. The electrical activity sensor according to claim 1 wherein the antenna element is formed in three or more loops arranged along a common axis.

4. The electrical activity sensor according to claim 1 wherein the antenna assembly comprises at least one dipole type antenna configured to operate as a half wave dipole in the operating frequency range of the antenna element and to magnetically couple to the antenna element wherein the dipole type conductor is operable to wirelessly transmit data representative of the power state change of the electrical device from the antenna assembly to a remote radio frequency data reader.

5. The electrical activity sensor according to claim 4 wherein the antenna element is coupled to the at least one dipole type antenna at a coupling distance from one end of the at least one dipole type antenna, the coupling distance being based upon at least one of an input impedance of a radio frequency identification circuit of the antenna element, a radiation resistance of the dipole type antenna.

6. The electrical activity sensor according to claim 1 wherein the size of the antenna element is adjusted according to an input impedance of a radio frequency identification circuit of the antenna element at an operating frequency.

7. The electrical activity sensor according to claim 1 wherein a distance between the antenna element and an at least one dipole type antenna is adjusted according to an input impedance of a radio frequency identification circuit of the antenna element at an operating frequency.

8. The electrical activity sensor according to claim 1 wherein the antenna element comprises an RFID tag.

9. An electrical activity sensor device for monitoring an electrical status of an electrical device, the electrical activity sensor device, comprising:
    a power cable for supplying power to the electrical device, the power cable comprising electrical power wires, wherein at least a part of each electrical power wire is shaped to form two parallel loops to magnetically couple with an antenna element attached to the power cable to induce a detectable electrical signal when the electrical device changes power state and wherein a size for the loop is based on a circumference of the power cable.

10. The electrical activity sensor according to claim 9 wherein each wire is shaped to form a plurality of loops in an axial direction along a length of said wire.

11. The electrical activity sensor according to claim 9 wherein each wire is shaped to form a plurality of loops in a direction perpendicular to a length of said wire.

12. An electrical activity monitoring system comprising:
at least one electrical activity sensor device attachable to a power cable of an electrical device for detecting a signal generated in the power cable in response to a change in electrical power state of the electrical device, the electrical activity sensor comprising an antenna assembly including: an antenna element operable to magnetically couple with an electrical pulse generated in the power cable in response to a change in electrical power state of the electrical device to induce an electrical signal; wherein at least a part of the antenna element is formed in a plurality of loops for magnetic coupling with the electrical pulse in the power cable, wherein a size for the plurality of loops is based on a circumference of the power cable and wherein the side of each loop of the plurality of loops has an axial length less than half of the circumference of the power cable;
a reader module for reading data received wirelessly from an electrical activity sensor; and
a monitor device for determining from the data received by the reader module, if any electrical device of an electrical network has changed electrical power status.

* * * * *